(12) United States Patent
Six

(10) Patent No.: US 7,893,781 B2
(45) Date of Patent: Feb. 22, 2011

(54) LOW-VOLTAGE MEMS OSCILLATOR

(75) Inventor: Jean-Claude Six, Saint Contest (FR)

(73) Assignee: NXP B.V., Eindhoven (NL)

(*) Notice: Subject to any disclaimer, the term of this patent is extended or adjusted under 35 U.S.C. 154(b) by 258 days.

(21) Appl. No.: 11/910,859

(22) PCT Filed: Mar. 31, 2006

(86) PCT No.: PCT/IB2006/050973

§ 371 (c)(1),
(2), (4) Date: Jun. 30, 2008

(87) PCT Pub. No.: WO2006/106456

PCT Pub. Date: Oct. 12, 2006

(65) Prior Publication Data

US 2008/0272852 A1 Nov. 6, 2008

(30) Foreign Application Priority Data

Apr. 8, 2005 (EP) .................................. 05300262

(51) Int. Cl.
*H03B 5/30* (2006.01)

(52) U.S. Cl. .................. 331/116 M; 331/154; 331/182; 333/186; 333/197; 310/309

(58) Field of Classification Search .................. 331/154, 331/116 M, 182; 310/309; 333/186, 197
See application file for complete search history.

(56) References Cited

U.S. PATENT DOCUMENTS

| | | | |
|---|---|---|---|
| 6,101,371 A * | 8/2000 | Barber et al. .................. | 455/73 |
| 6,184,755 B1 * | 2/2001 | Barber et al. ................ | 331/181 |
| 6,747,389 B2 | 6/2004 | Ma et al. | |
| 6,995,633 B2 | 2/2006 | Nakamura et al. | |
| 7,456,698 B2 * | 11/2008 | Gianchandani et al. ..... | 331/154 |
| 2002/0178831 A1 | 12/2002 | Takada | |
| 2003/0030527 A1 | 2/2003 | Mhani et al. | |
| 2004/0129953 A1 | 7/2004 | Tamura et al. | |

FOREIGN PATENT DOCUMENTS

| | | |
|---|---|---|
| CN | 1513228 A | 7/2004 |
| CN | 1516909 A | 7/2004 |
| WO | 2003/079439 A2 | 9/2003 |
| WO | 2004/030006 | 4/2004 |

OTHER PUBLICATIONS

Sadler, D. et al. "A Universal Electromagnetic Microactuator Using Magnetic Interconnection Concepts," J. of Microelectromechanical Systems, vol. 9, No. 4, pp. 460-468 (Dec. 2000).
Gatzen, H. et al. "An Electromagnetically Actuated Bi-Stable Mems Optical Microswitch," 12th Int'l. Conf. On Solid State Sensors, Actuators and Microsystems, Boston, pp. 1514-1517 (Jun. 2003).
Lange, D. et al. "Electromagnetic Actuation and MOS-Transistor Sensing for CMOS-Integrated Micromechanical Resonators," Sensors and Actuators A 103, pp. 150-155, Elsevier (2003).

* cited by examiner

*Primary Examiner*—Arnold Kinkead

(57) ABSTRACT

An electronic device for generating an electric oscillating signal is described based on a micro-electromechanical system (MEMS). The electronic device typically comprises a substrate a moveable element which is moveable with respect to the substrate and an actuating means and a sensor. The actuating means is used to induce vibration of the moveable element and comprises two inductive elements, a first one provided fixed to the substrate and a second one provided fixed to the moveable element. The induced vibration of the moveable element is sensed using the sensor and converted into an electric oscillating signal.

14 Claims, 9 Drawing Sheets

LOW-VOLTAGE MEMS OSCILLATOR

The present invention relates to microelectronics, especially oscillators. More particularly, the present invention relates to a method and system for generating an electric oscillating signal based on a micro-electromechanical system (MEMS).

In a wide field of electronic applications, such as e.g. micro-processor and micro-controller applications, communication applications, etc., quartz crystal oscillators are used for generating a reference frequency with a more or less accurate value. Quartz crystal oscillators typically have a high quality factor and are very stable. Nevertheless, they have the disadvantage of being bulky elements, which results in a difficulty of integrating them into semiconductor substrates. In other words, quartz oscillators are not well adapted to highly semiconductor integrated solutions.

Different attempts have been made to design oscillators, resonators or similar electronic components which can be integrated in substrates, such as e.g. semiconductor substrates. Several designs include systems based on electrostatic effects, which require relative high voltages that are not easily compatible with modern IC technologies. Different designs include oscillators or similar electronic components based on micro-electromechanical systems, also referred to as MEMS. Micro-electromechanical systems typically are microelectronic systems that combine mechanical or hydraulic functions with electrical functions. Typical applications thereof are optical switches, tunable lasers, sensors, valves, gears, mirrors and actuating means embedded in semiconductor chips. Particular applications of MEMS as electronic filters or electronic switches have already been reported. US Patent Application 2003/0030527 describes the use of a MEMS device for an electronic filter. The document describes an electronic filter that uses ferromagnetic materials to convert electrical energy into magnetic energy and further into mechanical energy in order to increase the sensitivity to higher frequencies compared to filters operating on electrostatic principles. Consequently, manufacturing of such a MEMS device requires the use of at least one ferromagnetic material, which is non-standard and provides little compatibility with standard semiconductor processing techniques.

It is an object of the present invention to provide manufacturing and operating methods and apparatus of improved oscillating electronic components for use in electronic devices. The methods of manufacturing and operating and the apparatus are based on micro-electromechanical systems. The above objective is accomplished by a method and device according to the present invention.

The invention relates to an electronic device for generating an electric oscillating signal based on a micro-electromechanical system, the electronic device comprising a substrate, an actuating means, a moveable element being moveable with respect to the substrate, and a sensor, the actuating means being adapted for generating movement of the moveable element and the sensor being adapted for converting movement of the moveable element into the electric oscillating signal, wherein the actuating means comprises a first inductive element and at least a second inductive element, the first inductive element being fixed to the substrate and the second inductive element being fixed to the moveable element. It is an advantage of the present invention that the electronic device for generating an electric oscillating signal can be integrated in semiconductor substrates, e.g. silicon substrates, thus offering highly integratable solutions or in other words devices with integrated functionalities on chip. It is an advantage of the electronic device for generating an electric oscillating signal that it is easily integratable using standard semiconductor processing techniques. The latter results in a simpler, lower cost realisation of an electronic device for generating oscillations. It is furthermore an advantage of the device that it only requires low voltages. It is also an advantage of the device that by selecting membrane properties a selection of the generated oscillating frequency can be determined. It is furthermore an advantage that the electronic device does not comprise exotic materials, e.g. ferromagnetic materials.

The sensor of the electronic device may comprise a magnetic field inducing inductive element fixed to the moveable element and a DC current source for providing a DC current in the magnetic field inducing inductive element.

The sensor of the electronic device may comprise a magnetic field sensing inductive element fixed to the substrate for converting a variable magnetic force acting on the substrate in an electric oscillating signal. It is an advantage of the electronic device that the sensor of the device is highly and easily integratable and can be made with standard semiconductor processing techniques. The sensor also may comprise a Hall sensor or a magnetostrictive element.

The first inductive element and the at least a second inductive element may be electrically connected to each other. Connecting the first inductive element and the at least a second inductive element may allow to provide these inductive elements with the same alternating current signal. The latter has the advantage that optimal force interaction between the first inductive element and the at least a second inductive element may be obtained, as no phase difference occurs.

The electronic device may furthermore comprise an electronic amplifying circuit adapted for receiving the electric oscillating signal from the sensor and for providing an amplified electric oscillating signal to the actuating means. It is advantageous of the electronic device that a resonant oscillating signal with a fixed amplitude may be obtained, which may be easily used as a reference signal. The electronic amplifying circuit may be adapted for receiving the DC current signal as gain input signal for the amplifier. This advantageously allows an easy control of the gain of the electronic device.

The device may comprise an alternating current source for providing an alternating current to the first inductive element and the second inductive element. It is an advantage of the device that part of the generated resonant oscillating signal can be re-used. It is an advantage of the present invention that low voltages can be used for actuating.

Each or a selection of the inductive elements may be an electromagnetic coil. It is advantageous that the electromagnetic coils may be implemented using standard semiconductor processing techniques. It is an advantage of the embodiments of the present invention that no high voltage in reference to advanced IC technologies, i.e. no voltage of 20V to 40V, is required as in many of the prior art systems, but that the invention can be used at a lower voltage, i.e. as low as 5V, as low as 3V or even as low as 1V. As the system uses currents, the supply voltages can be as low as possible as long as current can be generated in the low impedance elements and thus an amplifier can be made. The latter is obtained by using current based oscillators preventing the need for very high voltages on chip. In this way additional circuitry needed for generating these high voltages can be avoided.

The inductive elements may be implemented in plane with the substrate. This may result in a very efficient device.

The device may comprise a phase shifting and level controlling means for maintaining the electric oscillating signal at a fixed amplitude. It is an advantage that the device can be used for generating a reference oscillating frequency.

The micro-electromechanical system may be provided in a closed cavity. The closed cavity may be a closed vacuum cavity. The closed cavity may comprise a capping substrate and may comprise sealing elements for closing the cavity. It is an advantage of embodiments of the present invention that a high quality factor of the device can be obtained.

The moveable element may be a membrane. Selecting the membrane properties may allow to select a resonance frequency.

The invention also relates to a method for generating an electric oscillating signal based on a micro-electromechanical system on a substrate, the method comprising providing an alternating current in a first inductive element being fixed to the substrate and at least a second inductive element being fixed to a moveable element in order to generate a vibration of the moveable element, converting the vibration of the moveable element in an alternating magnetic force on the substrate and converting the alternating magnetic force on the substrate into an electric oscillating signal.

Converting the alternating magnetic force may comprise sensing the alternating magnetic force with a magnetic field sensing inductive element.

Converting the vibration may comprise providing a DC current through a magnetic field inducing inductive element provided on the moveable element.

The method furthermore may comprise amplifying the electric oscillating signal and providing the amplified electric oscillating signal to the first inductive element and the at least a second inductive element. Amplifying the electric oscillating signal may be controlled using the DC current.

The method furthermore may comprise maintaining the electric oscillating signal at a fixed amplitude. The electronic device for generating an electric oscillating signal as described in the embodiments of the present invention can advantageously be used as a low voltage reference oscillator.

It is also an advantage of the present invention that the electronic device for generating an electric oscillating signal allows miniaturisation. It thus is an advantage of the embodiments of the present invention that the dimensions of the electronic devices for generating electric oscillating signals are small. The size of the electronic device for generating an electric oscillating signal can be limited in all directions to a couple of hundred micrometer.

It is an advantage of the present invention that the electronic device for generating an electric oscillating signal according to the present invention can be used in virtually all systems wherein oscillators in integrated systems can be used. The electronic device for generating an electric oscillating signal can advantageously be used in all applications using a reference frequency whereby the reference frequency is needed with a more or less accurate value.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved methods and apparatus for generating an electric oscillating signal, e.g. a reference electric oscillating signal, as can be used e.g. in communication applications, microcomputers, etc.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
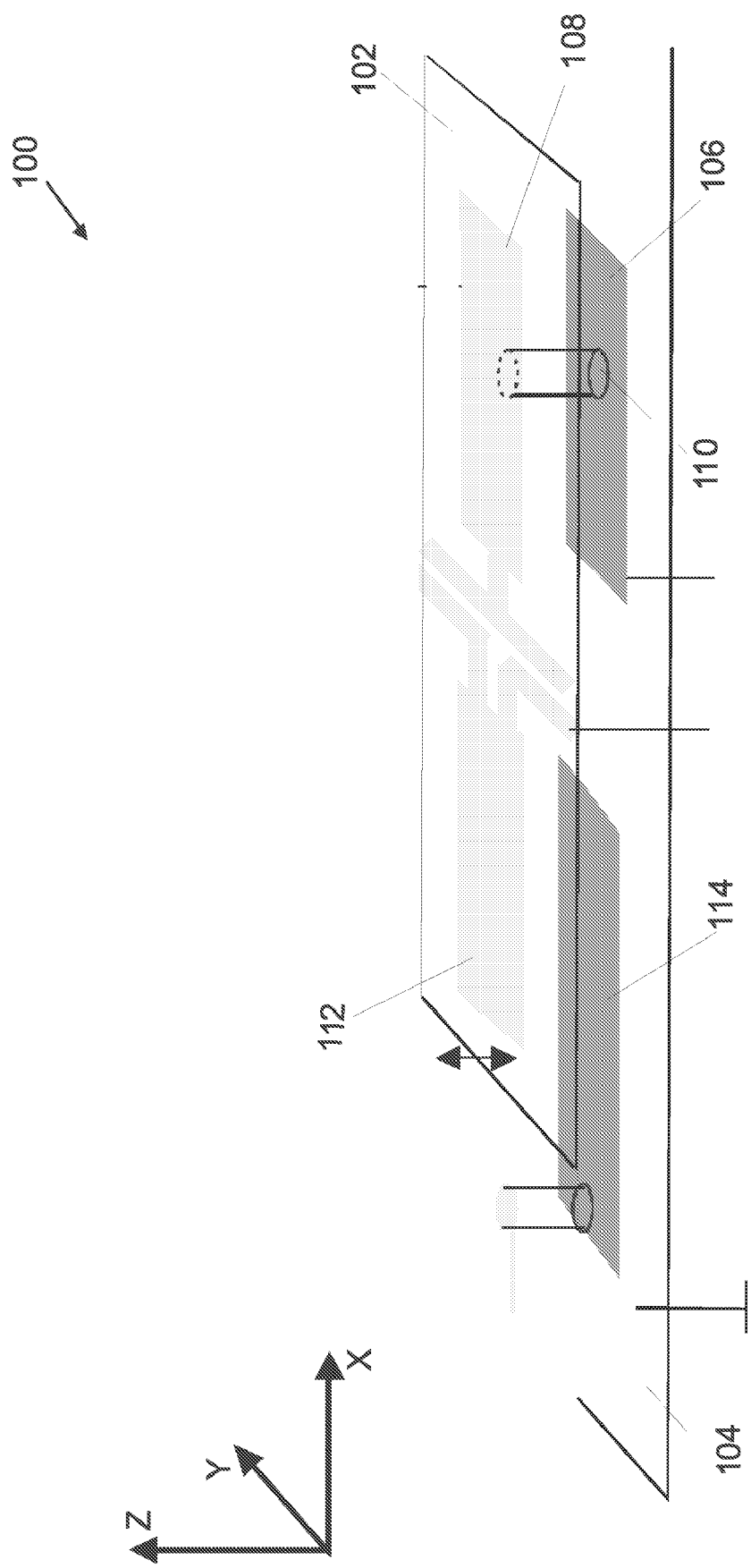
FIG. 1 is a side elevation view of a electronic device for generating an electric oscillating signal comprising a MEMS actuated by a set of inductive elements, according to a first embodiment of the present invention.

In the different figures, the same reference signs refer to the same or analogous elements.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

In a first embodiment, the present invention relates to an electronic device and a method for generating an electric oscillating signal based on a micro-electro-mechanical system, also referred to as MEMS. The device uses a moveable element, such as e.g. a vibrating membrane, and an actuating means as an oscillation frequency generator and a sensor for detecting the oscillation frequency and converting it into an electric oscillating signal. The frequency generation and preferably also the frequency detection thereby is based on a set of two inductive elements, allowing to manufacture the device in full compatibility with semiconductor processing techniques. Although the specific semiconductor processing techniques used are not limited, techniques allowing to obtain systems operating at very low voltage, such as e.g. MOS processing, are preferred. In preferred embodiments, standard semiconductor processing techniques are combined with as less as possible add-on steps to create the MEMS structure, e.g. with only a single add-on step to free the moveable element.

The system furthermore may comprise a feed-back system such that a stable resonance oscillation may be obtained at the main resonance frequency of the moveable element. In contrast to prior art systems, the oscillator need not to comprise the use of less-compatible or non-compatible exotic materials with respect to standard semiconductor processing techniques, such as e.g. ferromagnetic materials. The different components of the device will now be described in more detail, with reference to the drawings. A schematic representation of an electronic device for generating an electric oscillating signal 100 can be seen in FIG. 1. The electronic device for generating an electric oscillating signal 100 comprises a moveable element 102 which is mounted or formed above a substrate 104 such that it can vibrate freely with respect to the substrate 104. In practice, the moveable element 102 typically will not be completely disconnected from the substrate 104, but will have an anchoring point to the substrate, which mechanically spoken, can be seen as a pivot point or a turn-over point. The anchorage point typically may be provided in between the actuating means region and the sensing region. Nevertheless, large parts of the moveable element 102 will be able to move freely. The moveable element may be a planar structure, e.g. a thin flat plate or a membrane. The moveable element 102 is made of suitable materials allowing the moveable element 102 to vibrate. The moveable element 102, e.g. membrane, can therefore be executed in any type of stiff material, e.g. in metal, polysilicon, nitride etc. If e.g. an aluminum or copper layer is used as moveable element 102, a typical thickness may range from 1 µm to 10 µm, although the invention is not limited thereto. The moveable element 102 has a main resonance frequency, e.g. the main resonance frequency of a flexive mode in case of a membrane. The main resonance frequency thus preferably corresponds with the main resonance frequency of the flexive mode of the moveable element 102.

The device furthermore comprises an actuating means adapted for generating vibration of the membrane at its main resonance frequency. The actuating means comprises a first set of inductive elements, e.g. two or more electromagnetic coils. The set of inductive elements comprises a first inductive element 106, e.g. a first electromagnetic coil, and at least one second inductive element 108, e.g. a second electromagnetic coil. The first set of inductive elements may comprise one first inductive element 106 and one second inductive element 108. The first inductive element 106 is provided on the substrate 104, e.g. being an electromagnetic coil implemented as a first metal layer on substrate 104. The first inductive element 106 thus has a fixed position with respect to the substrate 104 or, in other words, is fixed to or formed in the substrate 104. The second inductive element 108 is implemented so it is floating freely with respect to the substrate 104. It can e.g. be an electromagnetic coil implemented as a second metal layer. The second inductive element 108 is mechanically coupled to the moveable element 102, e.g. membrane, or in other words fixed to or integral with the moveable element 102. The second inductive element 108 may thereby be a part constituting the membrane 102, or it may be connected to the moveable element 102, e.g. membrane, e.g. as a type of add-on mass to a separate membrane. The two inductive elements 106, 108 can be made on separate substrates as well as on the same substrate. The inductive elements, which may e.g. be electromagnetic coils, may be made of a metal for low loss. Typical examples thereof are aluminum, silver, gold, copper, etc. Preferably, the two inductive elements 106, 108 are made on the same substrate, based e.g. on an under-etching technique, as this reduces the needed manufacturing effort and the manufacturing cost. The first inductive element 106 and the second inductive element 108 may be electrically optionally connected together with a conductive via 110 in such a way that the second inductive element 108 can vibrate freely with respect to the first inductive element 106. The inductive elements 106, 108 are positioned substantially above one another such that providing a current in the inductive elements results in the occurrence of forces interacting between the inductive elements. By providing an alternating current (AC current) in both the first inductive element 106 and the second inductive element 108, a variable force is generated in the inductive elements 106, 108, resulting in a relative movement of the inductive elements 106, 108 with respect to each other which is used to move or maintain movement of the moveable element 102, e.g. membrane. The actuating means in other words comprises at least two inductive elements, a first one for generating a magnetic field and an at least second one for reacting to that field and thus acts as a "motor" for creating vibration of the moveable element 102. With alternating current flowing in the first and second inductive elements 106, 108, a variable force will push the inductive elements away from each other and the variations of the current will modulate the force by which the inductive elements are pushed away. In this way vibration of the moveable element 102 is created. Whereas in principle two similar alternating current signals could be used, each signal provided to one of the inductive elements 106, 108, it is preferred that the two inductive elements 106, 108 are electrically interfaced such that the same signal can be provided to both inductive elements 106, 108, using the conductive via 110. The latter improves the force coupling between both inductive elements as the signal in both inductive elements will be in phase. The vibration of the moveable element 102 thereby will only be provoked at the main resonance frequency of the moveable element 102, e.g. the main resonance frequency of the flexive mode of a membrane. The frequency of the AC signal therefore is selected to be the same as the main resonance frequency. In this way, the frequency of the membrane is not depending on electronic circuits but only on mechanical elements. Maximising and stabilising the Q factor of the system thereby allows to reduce damping of the oscillation. The MEMS therefore may be provided in vacuum, e.g. in a vacuum cavity. In this way, the moveable element 102, e.g. membrane, acts as a mechanical filter, resulting in a device with a high Q factor.

In order to generate an electric oscillation signal, the mechanical movement of the moveable element 102, i.e. vibration, needs to be sensed. Therefore, a means for sensing the vibration frequency of the moveable element is provided. The device thus has a sensing region (left hand side of FIG. 1) and an actuating region (right hand side of FIG. 1). By way of example, a sensor comprising a second set of two inductive elements and allowing sensing the vibration of the moveable element 102 and providing a corresponding electric oscillating signal will be described. The exemplary sensor comprises a magnetic field inducing inductive element 112, in the present application also referred to as the third inductive element, which is implemented in the moveable element 102, e.g. membrane. It furthermore comprises a sensing element that is provided to sense the magnetic field generated by the magnetic field inducing inductive element 112. This sensing element may be a magnetic field sensing inductive element 114, in the present application also referred to as fourth inductive element. The magnetic field sensing inductive element 114 is in the present example provided on or in the semiconductor substrate 104 physically positioned under the third inductive element 112. It will be clear that although the magnetic field inducing inductive element 112 is introduced in or on the moveable element 102 and the magnetic field sensing inductive element 114 is introduced in the substrate 104, the position of both inductive elements may be switched. The third and fourth inductive elements 112, 114 may e.g. be electromagnetic coils. These may be made of a metal for low loss. Typical examples thereof are aluminum, silver, gold, copper, etc. As the third inductive element 112 is implemented on or in the moveable element 102, e.g. membrane, a vibration of the moveable element 102 will result in a vibration of the third inductive element 112. The third inductive element 112 thus has no fixed position with respect to the substrate 104. A DC current is supplied to the magnetic field inducing inductive element by a current supply (not shown). Vibration of the third inductive element 112 is sensed by the fourth inductive element 114, as the third inductive element 112 is provided with the DC-current, which generates a changing magnetic field in the fourth inductive element 114, i.e. the DC-current creates a fixed magnetic field for the third inductive element 112 that due to the vibration is moved closer to and away from the fourth inductive element 114 and thus results in a changing magnetic field with respect to the substrate 104. The DC current running through the third inductive element may be in the range of some mA, such as e.g. 10 mA. The DC current may be supplied from the supply current of the total circuit. In other words, to save extra DC current drive from supply, the DC current may be obtained from a current flowing elsewhere in the system in which this oscillator is built in. In specific designs, a common supply point may be provided for the second inductive element 108 and the third inductive element 112. When the common supply point is the main supply point, a decoupling capacitor typically is used in order to create the proper signals in the different inductive elements. Alternatively, the common supply point may be the supply of current for the amplifier, whereby a decoupling capacitor is needed to feed the third inductive element. In this way only a DC signal in the third inductive element is provided in the third inductive element and an AC signal is provided in the first and the second inductive element. The variable magnetic field generated in the fourth inductive element 114 creates an oscillating electric signal corresponding with the main resonance frequency of the moveable element 102, e.g. membrane. A typical oscillation frequency that can be obtained with the electronic device for generating an electric oscillating signal lies in the RF range. Typically frequencies for example in the range having a lower limit of a few hundred kHz, e.g. 300 kHz and having an upper limit of a few MHz can be obtained, although the invention is not limited thereto. In order to get higher frequencies, typically smaller elements are required. These often are more difficult to make, less flexible or more fragile. Alternatively, higher frequency generation also may be based on vibration in the bulk of material. The third inductive element 112 and the fourth inductive element 114 can be made on the same substrate or on different substrates. Preferably, the third inductive element 112 and the fourth inductive element 114 are made on the same substrate, e.g. by under-etching, as this reduces the manufacturing effort and the economical cost.

Although the vibrational frequency sensor has been described above as comprising the combination of two inductive elements, other sensing devices may be used. In contrast to the actuating means, other detection means may be applied, as long as they are based on substrate integratable detection means. Sensing of the magnetic field generated by a magnetic field inducing inductive element, may be performed by any other suitable means for sensing a magnetic field, e.g. any of an integrated Hall sensor, a magnetostrictive element, piezoelectric sensors, etc. Although the sensor also could be based on changing a capacitor, the latter is less advantageous as it has the disadvantage of operating at relative high voltage, i.e. for example at 10V or higher. The generated electric oscillating signal in the sensor can be used as an output signal for several applications. The generated electric oscillating signal typically is small, i.e. in the order of a few micro volts. The signal may be fed to an amplifier 116 to create an amplified electric oscillating signal. Preferably, the device furthermore comprises a feedback loop, in order to stabilise the generated electric oscillating signal. In this way, not only an electric oscillating signal can be generated, but a reference electric oscillating signal at the main resonance frequency can be maintained.

The embodiments of the present invention can be implemented in a wide range of manners. Depending on the needed accuracy and additional influencing factors such as possible temperature drift and aging drift, the components of the electric device for creating an electric oscillating signal will be made in more or less stable materials. If un-stable but predictable implementations are used, these can be complemented with tuning systems in digital integrated circuits like e.g. Phase Locked Loops using e.g. a set of compensation tables. As already discussed, the substrate may be any type of substrate suitable for implementing inductive elements on it, such as e.g.—but not limited to—a semiconductor substrate.

Figure 2:
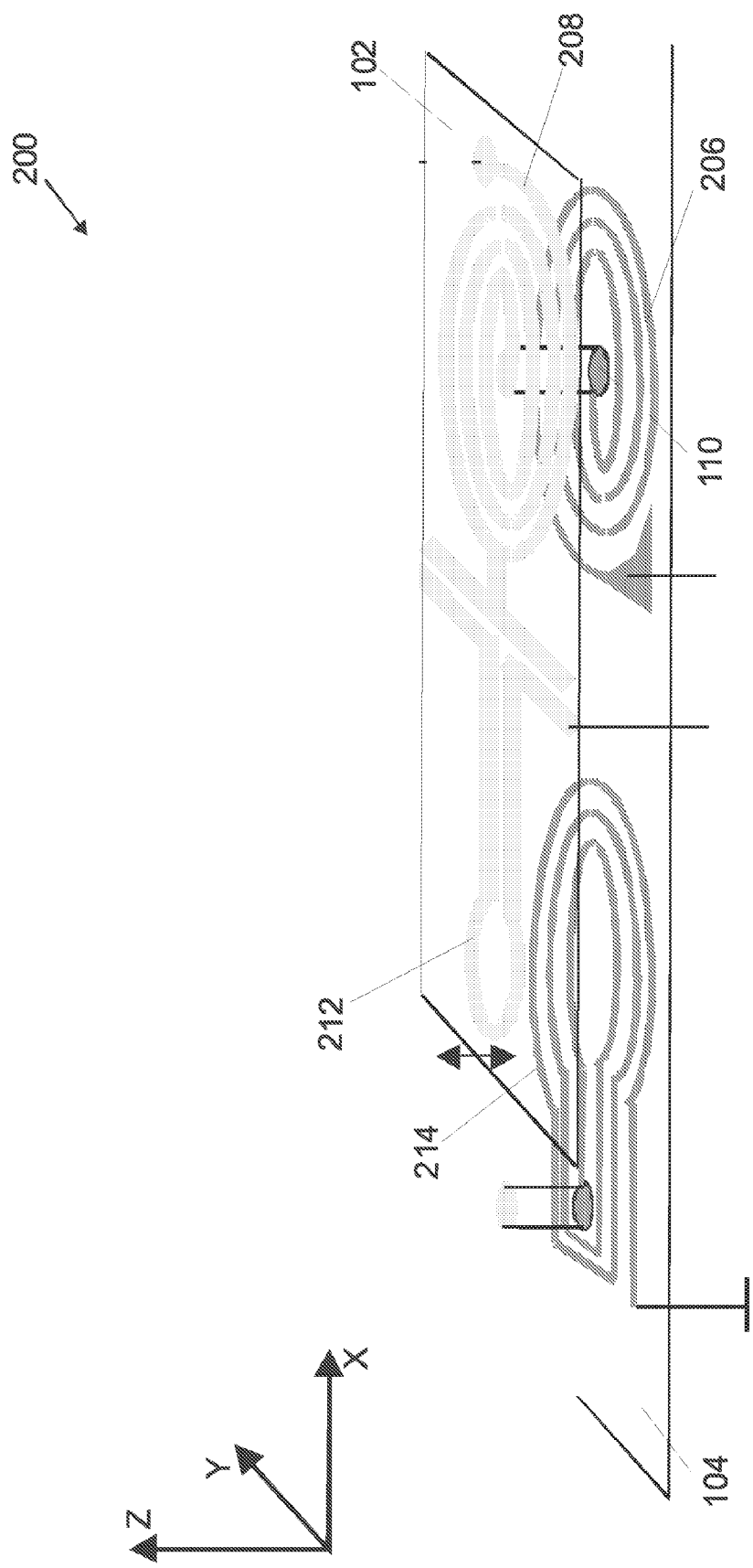
FIG. 2 is a side elevation view of a electronic device for generating an electric oscillating signal comprising a MEMS actuated by a set of electromagnetic coils, according to a first embodiment of the present invention.
Figure 3:
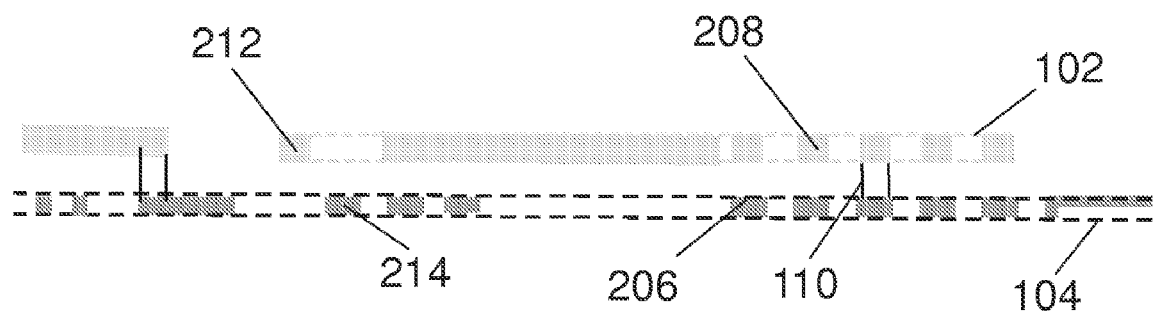
FIG. 3 is an X-Z cross-section of the electronic device for generating an electric oscillating signal comprising a MEMS actuated by a set of electromagnetic coils as shown in FIG. 2.

Preferably, the inductive elements 106, 108, 112, 114 are electromagnetic coils. The latter is advantageous as it allows to obtain a system operating at low voltage. Preferably the electromagnetic coils are electromagnetic spiral-shaped conductors which are oriented substantially in the plane of or parallel to the substrate. The axis of the electromagnetic coils thus may be substantially perpendicular to the plane of the substrate. Integratable inductors are described in the book "Design, Simulation and Applications of Inductors and transformers for Si RF IC's", Niknejad, Meyer, Kluwer Academic Press, 2000. In the device of the present invention, actuation using two flat inductive elements is very efficient and can be made with very flexible wiring. It furthermore is advantageous that, using flat inductive elements, the actuation and the sensing or detecting is performed along the central axis of the inductive elements, as in this way optimal energy transfer to and from the moveable element can be obtained. The use of electromagnetic coils allows use of standard semiconductor processing techniques for the manufacturing of the inductive elements. Such a device 200 using electromagnetic coils is shown in FIG. 2 and FIG. 3. FIG. 2 shows an elevated side view of the electronic device for generating an electric oscillating signal, whereas FIG. 3 shows an X-Z cross section. The first set of inductive elements, operating as actuating means for the membrane movement, then comprises two electromagnetic coils, i.e. a first electromagnetic coil 206 and a second electromagnetic coil 208, which are wounded one on the other. The first electromagnetic coil 206 is wound from the outside, i.e. the perimeter, to a central point. The central point of the first electromagnetic coil 206 is then connected, by means of the conductive via 110, to the central point of the second electromagnetic coil 208 which is wound from the central point outwards to the periphery. In principle, these coils 206, 208 can be on the same or on two different substrates. The second set of inductive elements, operating as sensor of the membrane movement, in the present example comprises at least one electromagnetic coil, referred to as the third electromagnetic coil 212. Optionally, the fourth electromagnetic coil 214 is provided, which is not connected electrically with the third electromagnetic coil. The electromagnetic coil 212 typically is a one-turn coil. In principle the two electromagnetic coils 212, 214 can be made on the same substrate or on separate substrates. Although the coils of the second set of inductive elements may be made in a separate processing step, they also may be made during the same processing steps as the production of the coils of the first set of inductive elements.

Figure 4:
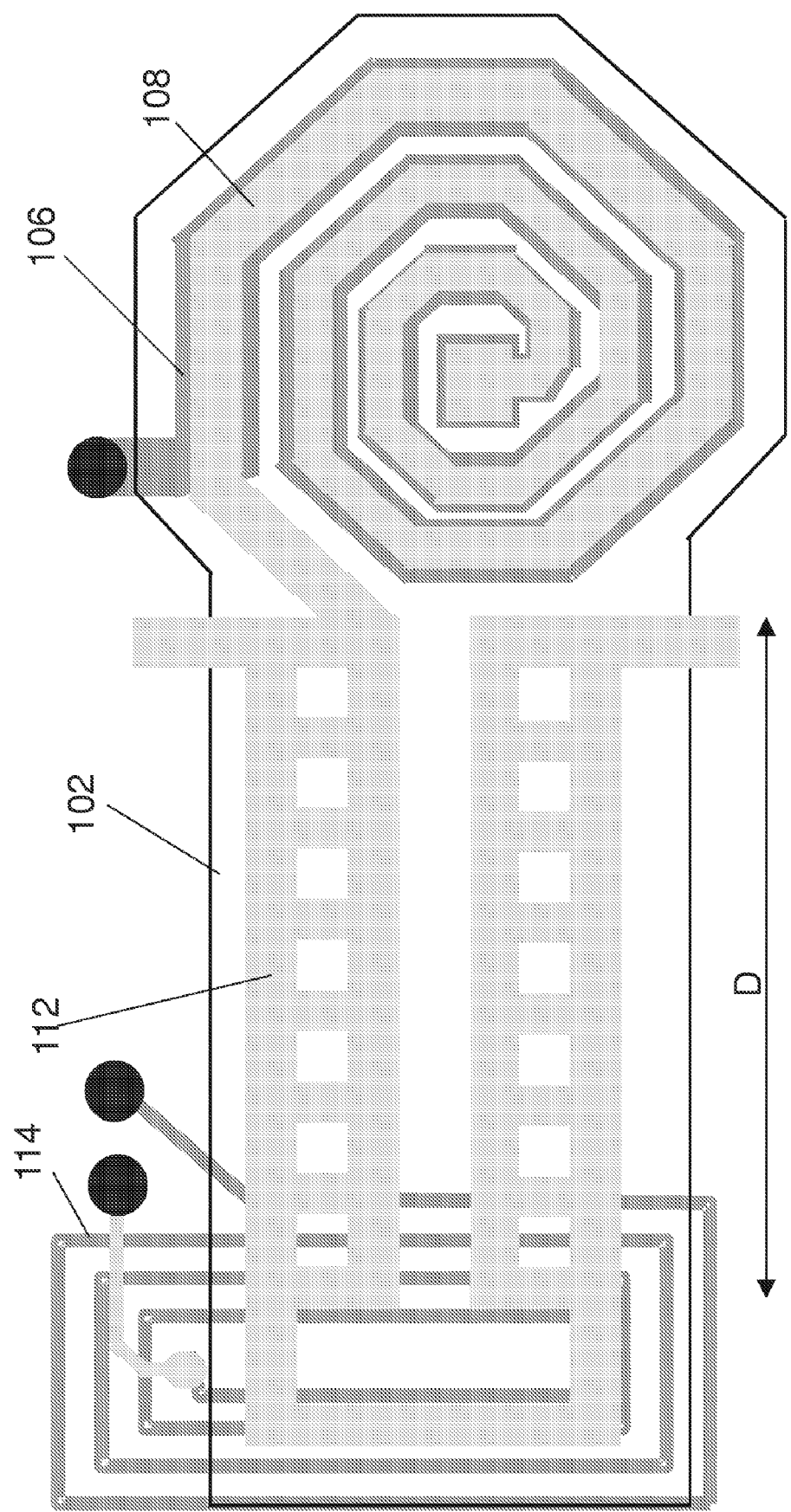
FIG. 4 is a first possible lay-out of a electronic device for generating an electric oscillating signal comprising a MEMS actuated by a set of electromagnetic coils, according to an exemplary embodiment of the present invention.
Figure 5:
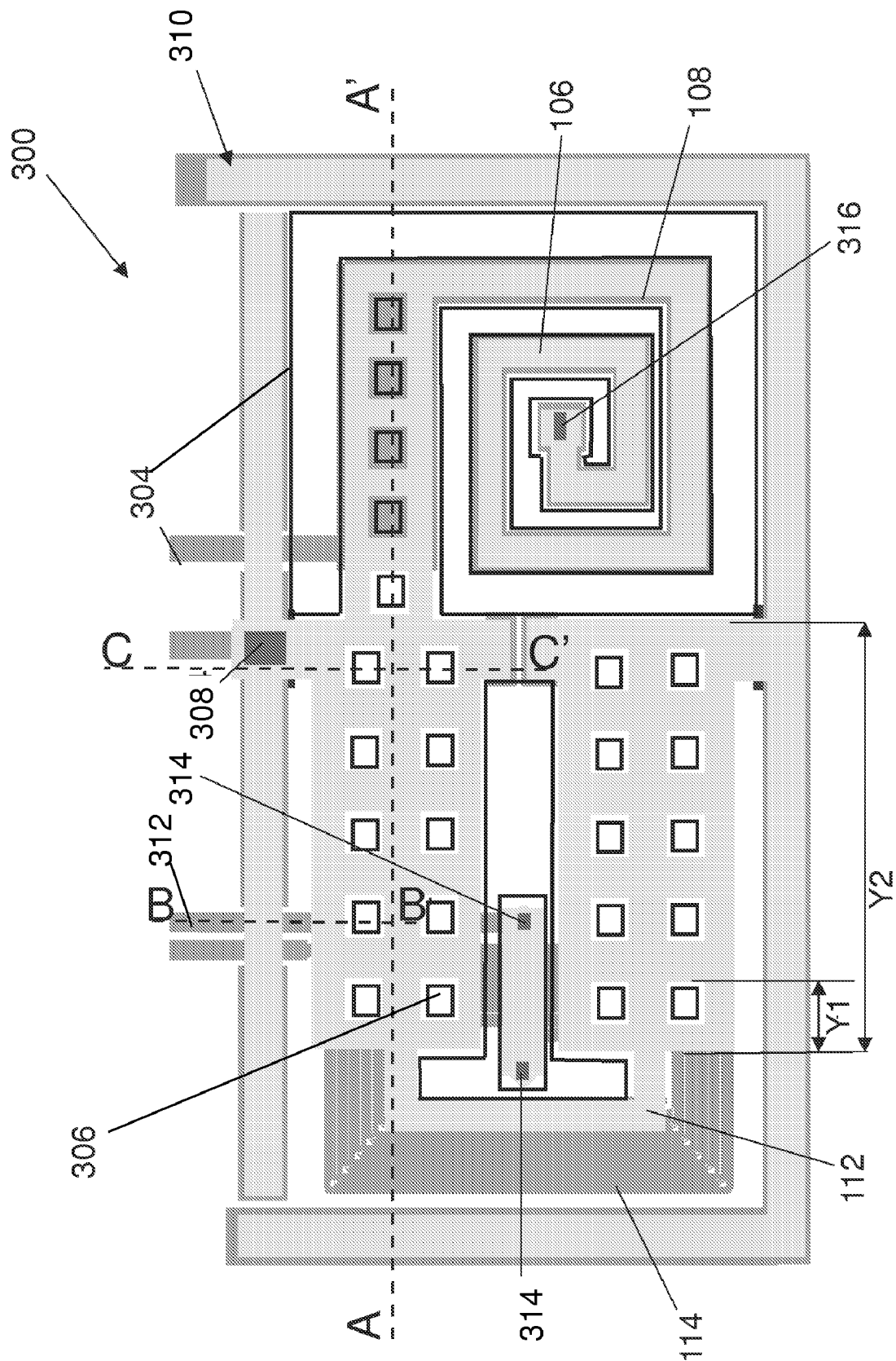
FIG. 5 is a second possible lay-out of a electronic device for generating an electric oscillating signal comprising a MEMS actuated by a set of electromagnetic coils, according to another exemplary embodiment of the present invention.

By way of illustration, some exemplary embodiments of electronic devices for generating an electric oscillating signal will be provided wherein the inductive elements are made in or on the same substrate, the invention not being limited thereto. In these examples, the inductive elements, being part of the MEMS, are made using an under-etching technique. FIG. 4 and FIG. 5 show two examples of electronic devices manufacturable by under etching. Although the structures will be described for electromagnetic coils, the electronic device for generating an electric oscillating signal of the present invention is not restricted thereto and any inductive element can be used.

Under etching may e.g. be done by providing a specific structure on a substrate and then disposing the substrate in a bath of etching agent. The general process for under etching of an insulation layer will first be described in more detail. The etch typically is selected to be a selective etch for the material of the insulation layer. In order to remove e.g. an insulation layer under a metal layer, first a substrate is covered with the insulation layer and a metal layer. On top of the metal layer, a passivation layer is provided to at least partially protect the metal layer from the etching agent, as the selectivity of the etch may not be fully guaranteed. Under etching then occurs by bringing the insulation layer in contact with the etching agent. As the initial allowable distance in horizontal direction between the insulation layer and the etching agent needs to be limited, e.g. to around 3 μm for under etching of oxide, in order to obtain a sufficient quality of under etching, the distance of all areas of the insulation layer to be under etched to areas not covered with material should also be limited to that distance, e.g. to 3 μm or less for oxide under etching. Consequently if a more broad area needs to be under etched, holes need to be provided in the passivation layer and the metal in order to allow free access of the etching agent to the insulation layer. The size of these holes typically will depend on the type of etching agent and the material to be under etched. For e.g. oxide under etching in a bath of butene ethyl glycol, also referred to as BEG, the holes typically are at least 2 μm by 2 μm. The holes then are the only areas where the under-etching chemistry can flow to dissolve the oxide layer to be sacrificed thus freeing the mechanisms. Contacting the structure with the etching agent, possibly through holes in case a broad area needs to be under etched, then allows for under etching.

Figure 6A:
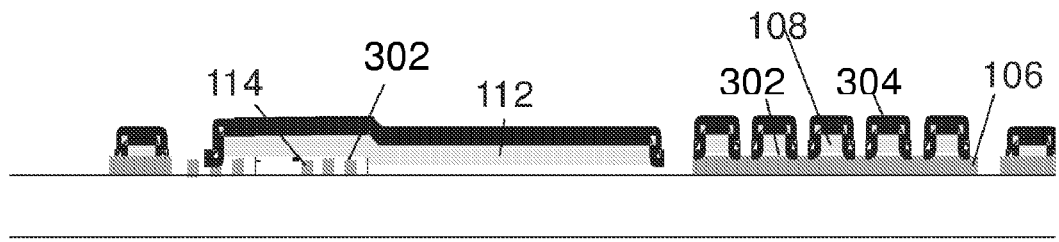
FIG. 6a is a cross sectional view along line A-A' of the lay-out of the electronic device for generating an electric oscillating signal as shown in FIG. 5.
Figure 6B:
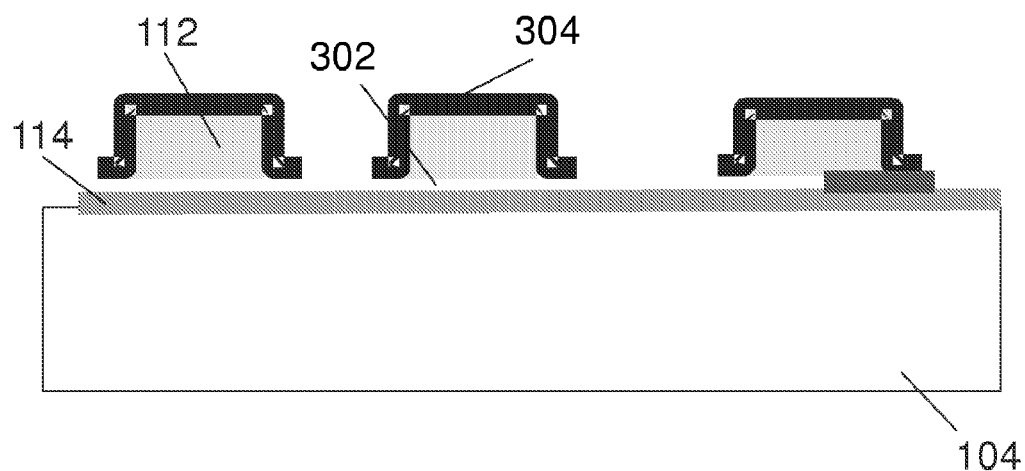
FIG. 6b is a cross sectional view along line B-B' of the lay-out of the electronic device for generating an electric oscillating signal as shown in FIG. 5.
Figure 6C:
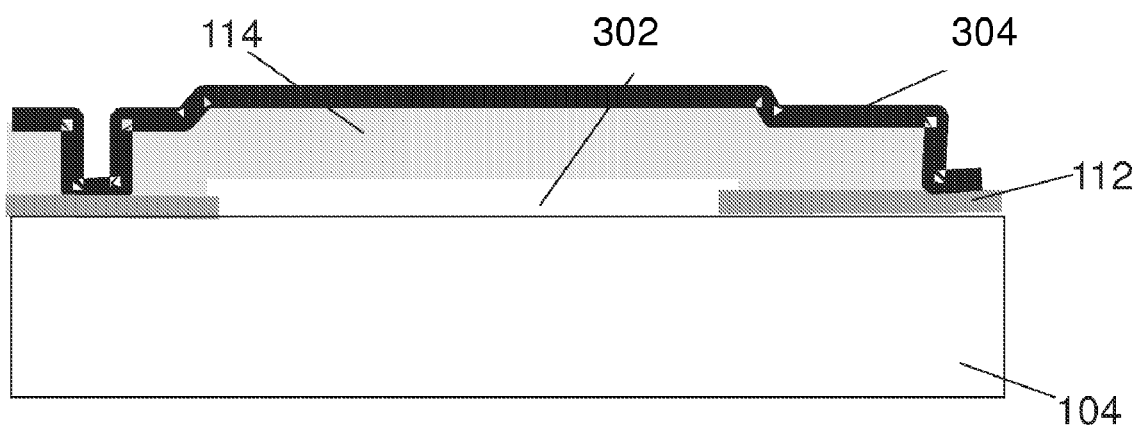
FIG. 6c is a cross sectional view along line C-C' of the lay-out of the electronic device for generating an electric oscillating signal as shown in FIG. 5.
Figure 7A:
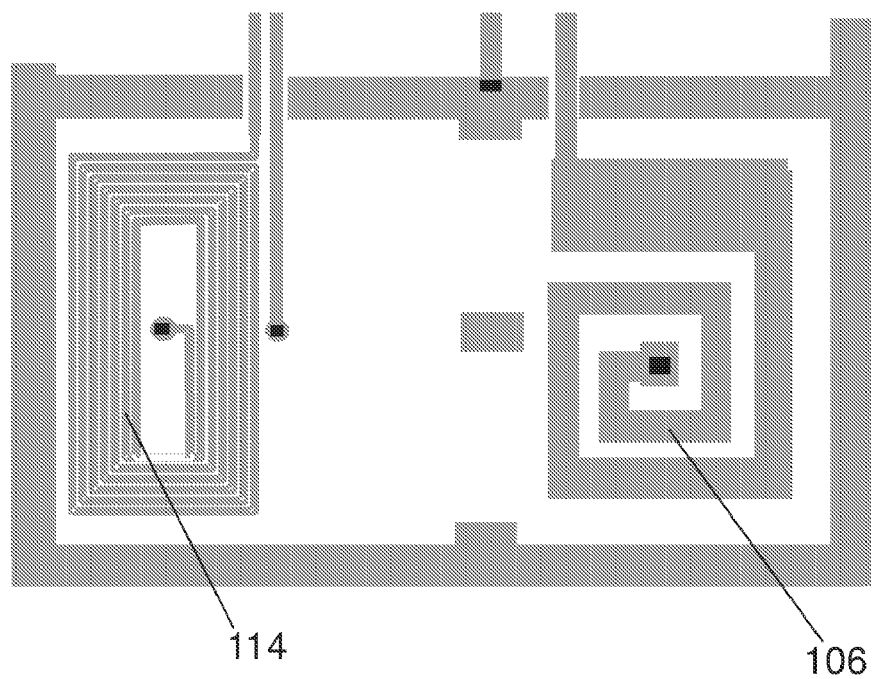
FIG. 7a is a layout of the first material layer comprising the first electromagnetic coil and the fourth electromagnetic coil of the electronic device for generating an electric oscillating signal as shown in FIG. 5.
Figure 7B:
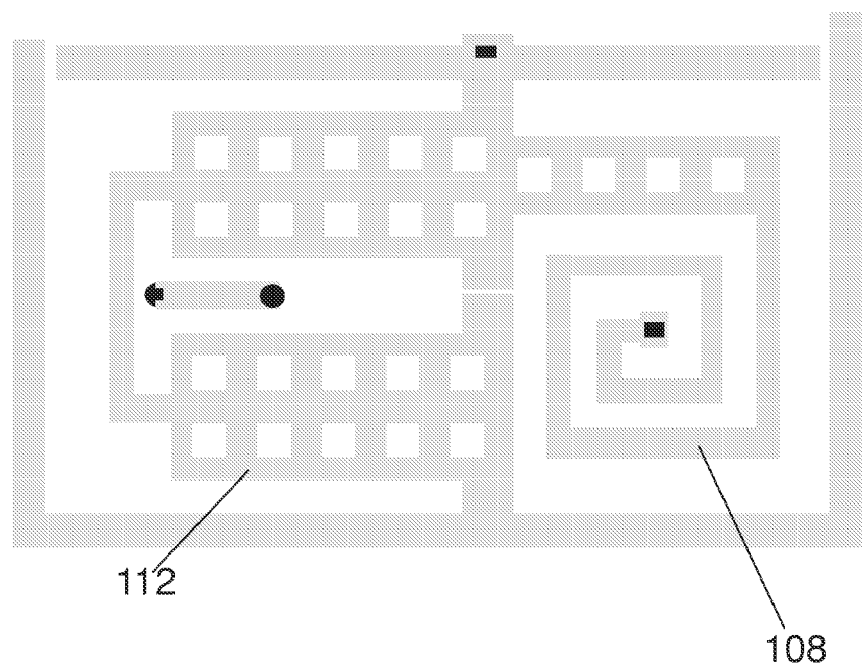
FIG. 7b is a layout of the second material layer comprising the second electromagnetic coil and the third electromagnetic coil of the electronic device for generating an electric oscillating signal as shown in FIG. 5.

Returning now to the examples shown in FIG. 4 and FIG. 5. In FIG. 4 a first example of a electronic device for generating an electric oscillating signal is shown whereby the MEMS is formed by under etching. The first inductive element 106 and the fourth inductive element 114 thereby do not need to be made in the same semiconductor processing step, and thus may—although the invention is not limited thereto—be made of a different material and may be positioned at a different height with respect to the substrate. The second inductive element 108 and the fourth inductive element 112, also may be made of different materials and in different semiconductor processing steps, although the invention is not limited thereto. Nevertheless, preferably, the first and the fourth inductive elements 106, 114 are made of the same first material during the same semiconductor processing steps and the second and the third inductive elements 108, 112 also are made of a same, second material during the same semiconductor processing steps. The latter is advantageous as it reduces the number of semiconductor processing steps needed and thus reduces the complexity of the device, the needed effort and consequently the cost for manufacturing. A second exemplary electronic device, having four inductive elements generated only in two different layers, is shown in top view in FIG. 5 and in cross sectional view in FIG. 6a to FIG. 6c. FIG. 7a and FIG. 7b show the layout of the first material wherein the first and fourth inductive elements 106, 114 are made and the layout of the second material wherein the second and third inductive elements 108, 112 are made respectively. It will be clear that the exemplary electronic device for generating an electric oscillating signal shown in FIG. 5 to FIG. 7b is shown by way of illustration and that the invention is not limited thereto. The electronic device for generating an electric oscillating signal 300 shown in FIG. 5 comprises a first inductive element 106, in the present example being an electromagnetic coil consisting of 3 turns of a 1 micron thick layer of the first material, and a second inductive element 108, in the present example being an electromagnetic coil consisting of a 3 micron thick layer of the second material. In between the inductive elements, an insulation layer (not shown in FIG. 5 to FIG. 7b), in the present example being a silicon oxide of 0.5 micron thick, is provided. This insulation layer is sacrificed during under etching, resulting in an etched volume 302 comprising no solid material. Besides the insulation layer, a conductive via between the first inductive element 106 and the second inductive element 108 is provided, such that the inductive elements 106, 108 are electrically connected to each other. In the present example, the third inductive element 112, being part of the sensing element, is an electromagnetic coil implemented as a single turn made in the same layer as the second inductive element 108, in the present example being a 3 micron thick layer of the second material, and the fourth inductive element 114, also being part of the sensing element, is implemented as an electromagnetic coil having a number of turns made in the same layer as the first inductive element 106, in the present example being a 1 micron thick layer of the first material. The first inductive element 106 and the fourth inductive element 114 thus have the same thickness and the second inductive element 108 and the third inductive element 112 have the same thickness. The first material and the second material may be the same material or different material. These materials may be a low loss metal, such as e.g. aluminum, gold, silver, copper, etc. On top of the second inductive element 108 and the third inductive element 112, a passivation layer 304, e.g. a nitride layer, may be provided, which in the present example is a 1.5 µm thick nitride layer, and which is used as a protective layer for the second and third inductive element during under etching. Advantageously, an additional thin protective layer, such as e.g. a nitride, may be provided in between the first and fourth inductive element on the one hand and the under etchable insulation layer, being an oxide, i.e. a silicon oxide in the present example, on the other hand. The latter allows to protect the first and fourth inductive elements during the under etching. It can be seen in FIG. 5 that access holes 306 are provided in the passivation layer and the second and third electromagnetic coils to allow access for under etching of the insulation layer in broad areas of the second and third electromagnetic coils. The holes are provided such that sufficient removal of the insulation layer between the electromagnetic coils can be done. It is an advantage of this exemplary embodiment that the production of the first inductive element and the fourth electromagnetic inductive element can be done using the same semiconductor processing step(s). The latter can be made e.g. by depositing a conductive material and consequently etching through a mask, such that an inductive element, e.g. electromagnetic coil, is formed. Alternatively, the inductive elements also can be made by creating a mold with appropriate shape for an electromagnetic coil in the substrate and filling the mold with a conductive material. The production of the second inductive element and the third inductive element also can be done using the same semiconductor processing step(s). The latter can e.g. be done by providing a layer of conductive material and etching an appropriate shape for the inductive element. Furthermore under etching of the oxide under the second inductive element and under the third inductive element can be done using the same semiconductor processing step(s). Under etching allows to free the second and third inductive elements. In FIG. 6a, a cross sectional view along line A-A' of FIG. 5 is shown. The cross section shows the relative position of the different electromagnetic coils 106, 108, 112, 114, spaced by the etched volume 302. Furthermore, the passivation layer 304 and the access holes 306 are shown. In FIG. 6b, a cross section along line B-B' of FIG. 5 is shown, illustrating the different components near the sensor output, formed at the fourth inductive element 114. In FIG. 6c, a cross section along line C-C' of FIG. 5 is shown, illustrating the different components near the transition area between the second and the third inductive element. The obtained structure shown in FIG. 5 has a vibrating membrane with a length of about 60 µm and a width of two times 15 µm. FIG. 7a shows the lay-out for the first material wherein the first inductive element 106 and the fourth inductive element 114 are made. FIG. 7b shows the lay-out for the second material wherein the second inductive element 108 and the third inductive element 112 are made. The semiconductor processing techniques needed for manufacturing of the circuit of the present invention advantageously can be standard semiconductor processing techniques. Furthermore, in FIG. 5 a common input connection point 308 between the third inductive element 112 and the second inductive element 108 is shown and a second output point 310 of the third inductive element 112 is indicated. Furthermore, an output point of the sensor 312, i.e. an output point of the fourth inductive element 114 is indicated. An electrical via 314 closes the fourth inductive element 114. Furthermore an input point 316 at which the initial AC signal is provided to the first inductive element 106. Additional layers may be provided in the device according to the present invention, such as e.g. a preparation layer used to be able to solder caps on silicon wafers, e.g. to create a cavity and for electrical connections. If e.g. aluminum is used as metal layer, a nickel gold layer may be provided as preparation layer.

Figure 8:
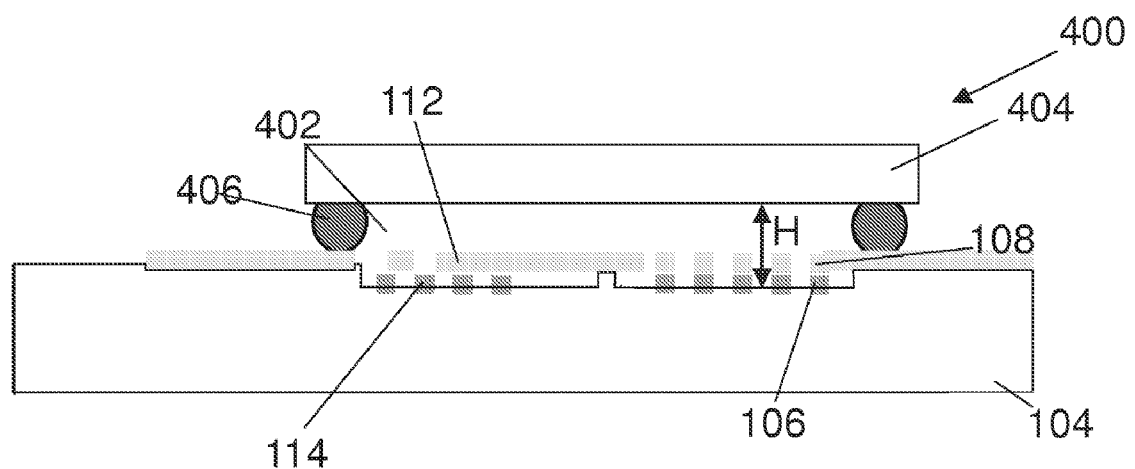
FIG. 8 is a cross sectional view of a electronic device for generating an electric oscillating signal comprising a MEMS actuated by a set of inductive elements enclosed in a cavity, according to a second embodiment of the present invention.
Figure 9:
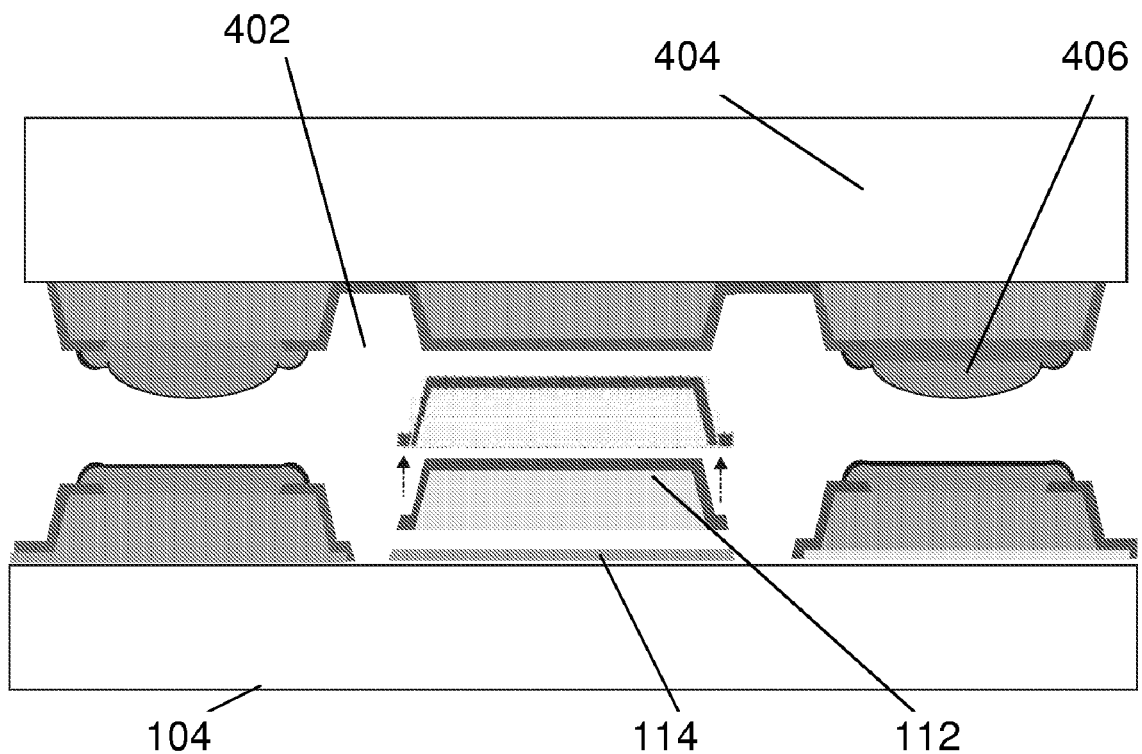
FIG. 9 is a cross sectional view of a electronic device for generating an electric oscillating signal comprising a MEMS actuated by a set of inductive elements enclosed in a cavity, according to a second embodiment of the present invention.

In a second embodiment, the invention relates to an electronic device as described in any of the previous embodiments, wherein the MEMs component of the electronic device for creating an electric oscillating signal is positioned in a cavity. The cavity preferably is a vacuum cavity, although the invention is not limited thereto. The cavity also can e.g. be filled with a gas. Housing the MEMS in a cavity, preferably a vacuum cavity such that the moveable element 102 can float in vacuum, allows free vibration of the moveable element 102 such that a very high quality coefficient Q is obtained for the oscillation frequency generation. The Q factor may be e.g. between 100 to 1000 in vacuum. The level of vacuum is not very critical as it only affects the mechanical Q of the membrane, i.e. a lower vacuum only introduces a damping effect. If the level of vacuum is lower, more energy will be needed to keep oscillating, thus requiring more coupling between the actuating means and the membrane of the device. The membrane then is less "free" to oscillate on its main resonance frequency. An example of a vacuum level that can be obtained is e.g. $10^{-2}$ mbar, although the invention is not limited thereto. If the MEMS is located in a vacuum cavity with sufficiently high vacuum, substantially no damping of the vibration occurs. A detailed description of an example of how to create a cavity for semiconductor substrates, e.g. in between two silicon layers, using a sealed ring made of solder bumps, is given in International Patent Application WO 03/079439 by Koninklijke Philips Electronics N.V. Realising reflow of the ring made of solder bumps in a vacuum oven allows to obtain a vacuum cavity. In a preferred embodiment of the present invention, silicon substrates may be used for creating the cavity. An example of part of an electronic device 400 for generating an electric oscillating signal with a MEMS structure incorporated in a closed cavity 402, closed with a capping substrate 404, is shown in FIG. 8. Some typical elements of the MEMS structure are shown, incorporated in a cavity 402 formed by the substrate 104, the capping substrate 404 and sealing elements 406, such as e.g. a sealed ring made of solder bumps. The solder bumps may be made of any suitable material, such as e.g. tin. A typical height H of the cavity, although the invention is not limited thereto, may be e.g. 20 µm. The capping substrate 404 may e.g. be made of a capping material having no further function than the closing of the cavity or the capping substrate 404 may have an additional function, i.e. it may for example be an active integrated circuit positioned on top of the cavity. For example, the amplifier circuitry used in the electronic device may be integrated in the capping substrate 404. In this way, all functional components of the electronic device for generating an electric oscillating signal can be integrated in a device having limited dimensions, i.e. whereby e.g. the thickness in the Z-direction of the device is limited to a few hundred microns. As the mechanical part of the system typically may be sized around 120 µm×60 µm, the dimensions in the X-Y plane also are strongly limited, resulting in a real microstructure.

Figure 10:
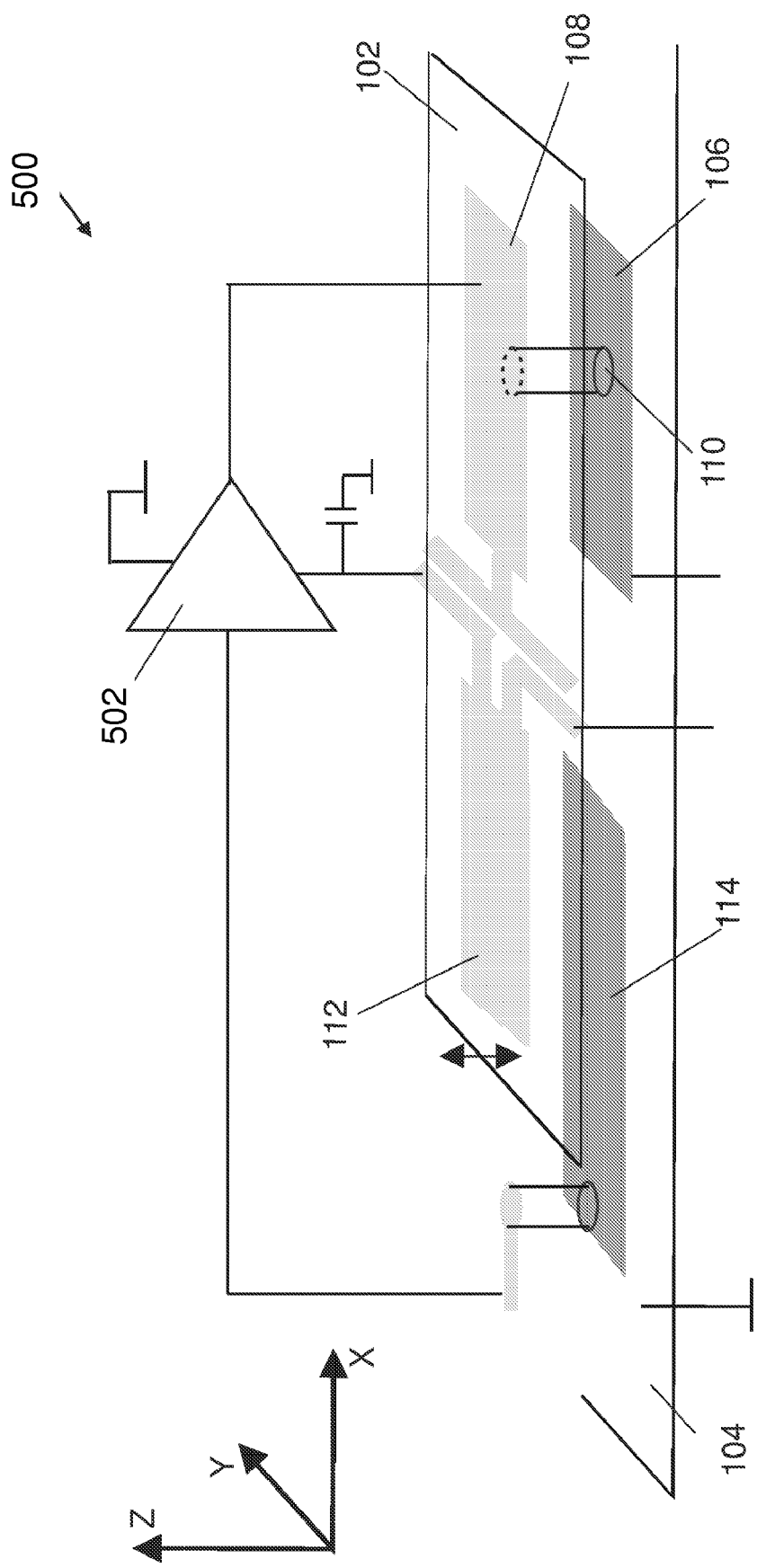
FIG. 10 is a cross sectional view of an electronic device for generating an electric oscillating signal comprising a MEMS, wherein a frequency resonance loop is provided according to a third embodiment of the present invention.

In a third embodiment, the present invention relates to an electronic device as described in any of the above described embodiments, wherein furthermore a feed back loop is provided. In this way, a stable electronic device 500 for generating an electric oscillating signal, as shown in FIG. 10, is created providing an electric oscillating signal with a fixed amplitude. The system can be advantageously used as a reference oscillator. The latter is obtained by feeding the output signal of the sensor, i.e. for example the signal generated by the magnetic field sensing inductive element 114 in some embodiments, to an electronic circuit 502 for amplifying the signal, also referred to as amplifying circuit, and by feeding back the amplified signal to the first and the second inductive element of the actuating means. By proper design of the electronic circuit 502 for amplifying, i.e. by adjusting the phase and the gain, a stable electronic device for generating an electric oscillating signal 500 is obtained whereby the signal is kept at a fixed amplitude. In a stable vibrating mode, the second inductive element 108 will not move a lot whereas the moveable membrane near the sensing part will undergo significant movement, since the membrane is self oscillating and looses only a small amount of energy at each cycle, whereby the actuating means is only used to compensate for these losses. This significant movement is caused by the high Q factor of the vibration of the part of the moveable element 102 near the sensing side. It is expected that a ratio of amplitude in line with the Q factor of that part of the moveable element 102, e.g. membrane, is obtained. The amplitude of the vibration will nevertheless be chosen to be limited such that it does not hit the substrate. The amplifying circuit should phase the output signal compared with the input signal to get maximum gain. Typically, a phase shift therefore is induced, which depends on several mechanical and/or electromechanical factors. Similarly the gain is adjusted to drive the actuating means to maintain oscillation without overdrive. The gain thereby is higher to initiate the oscillation, i.e. at start-up time, than when the system is in stable operation. The electronic amplifying circuit 502 thus may be any electronic circuit that allows amplification of the signal whereby the phase and gain adjustment can be guaranteed. Such circuit can be based on a unipolar transistor such as a e.g. a field effect transistor (FET) but also may be another type of transistor such as e.g. a MOS, a PHEMT, a bipolar junction transistor (BJT) or a heterojunction bipolar transistor (HBT). The electronic circuit 502 thus amplifies the small sensed voltage, i.e. the electric oscillating signal, in order to generate an amplified electric oscillating signal, being an alternating current (AC current) which is fed to the first pair of inductive elements, i.e. the first inductive element 106 and the second inductive element 108. By providing a feed back loop as described in the present embodiment, an electronic device for generating an electric oscillating signal is created, which resonates at the main resonance frequency of the moveable element 102, e.g. membrane. The main resonance frequency of the moveable membrane thus sets the frequency of the device. The oscillation will be optimal at a higher loop gain whereby all elements, i.e. the amplifying circuit, the actuator and the sensor provide maximum gain. In this way, the device will optimally maintain oscillation on the main resonance frequency of the membrane flexive mode. Optionally, if the sensor comprises a magnetic field inducing inductive element 112 as illustrated in FIG. 10, the DC-current that is provided to the magnetic field inducing inductive element 112, can be used for controlling the gain of the loop. The DC signal thus can be used as a gain signal for the electronic circuit for amplifying 502 or in other words, the amplifier gain can be regulated with the DC current that is provided through the third inductive element 112. In this way, a direct link with the power consumption of the electronic circuit for amplifying 502 is obtained, whereby for a higher DC current a higher loop gain is obtained. The DC current provided in the third inductive element furthermore can be re-used from the electronic circuit for amplifying supply. Consequently, the DC current running through the inductive element 112 thus may be either selected to be independent from the supply current of the electronic circuit for amplifying, whereby the DC input is connected to a current limiting resistor going to a ground or, alternatively, the DC current may be re-used to feed the electronic circuit for amplifying 502, whereby the DC input is connected as supply current for the electronic circuit for amplifying 502 and a decoupling capacitor is provided between an actuating means input point and the ground. In the latter case, less current will be consumed as there is re-use of current, but a stronger decoupling capacitor is needed. After initiation of the vibration, the required AC current that needs to be additionally supplied to the inductive elements 106, 108 to maintain vibration is expected to be very low as it is only necessary to compensate losses due to damping of the vibration of the moveable element 102 and losses due to some energy stolen by the fourth inductive element for sensing. The electronic circuit 502 fed by the output signal of the sensor preferably may be a very high input impedance amplifier. The AC current fed through the first and second inductive element may be small, e.g. about 100 µA.

The electronic device for generating an electric oscillating signal of certain embodiments of the present invention are particularly useful to be placed on a Passive Integration Silicon Substrate (PICS). Typically, thereby a single low-cost silicon die is produced that not only carries all the passive components but also the interconnect pattern between them. Due to the ease of integration of the MEMS structure in semiconductor substrates, such as e.g. silicon, combining the electronic device for generating an electric oscillating signal with PICS can advantageously be performed. In other words, integration in silicon based system-in package of a reference oscillator function can be advantageously performed using the embodiments of the present invention. In this way, e.g. a total radio function could be integrated in a single silicon based package. Further integration by flipping several dies executed in different technologies based on active functions, BAW filters, MEMS, etc. can be advantageously performed.

Other arrangements for accomplishing the objectives of the electronic device for generating an electric oscillating signals embodying the invention will be obvious for those skilled in the art.

It is to be understood that although preferred embodiments, specific constructions and configurations, as well as materials, have been discussed herein for devices according to the present invention, various changes or modifications in form and detail may be made without departing from the scope and spirit of this invention. For example, whereas in the above described embodiments, a description of specific alternative devices for generating an electric oscillating signal is given, the invention also relates to methods for generating an electric oscillating signal based on a MEMS having an actuating means operated by inductive elements. The method typically comprises the steps of actuating a moveable element such that vibration of the moveable element is induced, whereby the actuating is performed by highly integratable actuating means. The latter may e.g. be performed using a set of two inductive elements, one inductive element, e.g. a first inductive element, introduced in, or fixed to, a substrate of the device and one inductive element, e.g. a second inductive element, introduced in, or fixed to, a moveable element moveable with respect to the substrate. These inductive elements may be electromagnetic coils. These inductive elements may be positioned above one another. By providing an alternating current in these inductive elements, changing, alternating forces are generated between the inductive elements which result in vibration of the moveable element, or at least vibration of a moveable part of the moveable element. Actuating thus may e.g. be performed by providing an alternating current in the set of two inductive elements. The movement, i.e. vibration, of the moveable element then is converted in an alternating magnetic force on said substrate, i.e. with respect to said substrate. The converting may e.g. be performed by providing a DC current through an inductive element, e.g. a third inductive element, introduced in, or fixed to, a moveable part of the moveable element. The latter allows to generate a fixed magnetic force with respect to the moveable element, and upon vibration, a changing magnetic force with respect to the substrate. The changing or alternating magnetic force on the substrate then is measured and converted in an alternating electrical signal, which may be a generated electric oscillating signal. Such conversion may e.g. be done using an inductive element, e.g. a fourth inductive element, although other means, that provide a high degree of integratability in the substrate, also may be used. The generated electric oscillating signal, obtained at the output point of the sensor means which may be constituted of the third and the fourth inductive element, may be used directly or may be first amplified. Optionally the generated electric oscillating signal may be amplified in an adapted electronic circuit, e.g. amplifier, and the amplified generated electric signal may be at least partly used for actuating the moveable element. The latter may be e.g. performed by feeding the amplified generated electric oscillating signal to the inductive elements of the actuating means. The gain and the phase obtained during amplifying may thereby be controlled in order to generate a generated electric oscillating signal with a fixed amplitude. The gain of the amplified generated electric oscillating signal may be at least partly determined by feeding a DC, signal used in a third inductive element for converting movement of the moveable element in a changing magnetic force, as a gain control signal in the adapted electronic circuit, e.g. amplifier. The above described methods can advantageously be performed using the electronic devices for generating electric oscillating signals as described in the embodiments of the present invention.

The invention claimed is:

1. An electronic device for generating an electric oscillating signal based on a micro-electromechanical system, said electronic device comprising a substrate, an actuating means, a moveable element being moveable with respect to said substrate, and a sensor, said actuating means being adapted for generating movement of said moveable element and said sensor being adapted for converting movement of said moveable element into the electric oscillating signal, wherein said actuating means comprises a first inductive element and at least a second inductive element, said first inductive element being fixed to said substrate and said second inductive element being fixed to said moveable element, said sensor comprising a magnetic field inducing inductive element fixed to said moveable element and a DC current source for providing a DC current in said magnetic field inducing inductive element.

2. An electronic device-according to claim 1, wherein said first inductive element and said at least a second inductive element are electrically connected to each other.

3. An electronic device according to claim 1, wherein said electronic device furthermore comprises an electronic amplifying circuit adapted for receiving said electric oscillating signal from said sensor and for providing an amplified electric oscillating signal to said actuating means.

4. An electronic device according to claim 3, wherein said electronic amplifying circuit further is adapted for receiving said DC current signal as gain input signal for said electronic amplifying circuit.

5. An electronic device according to claims 3, wherein said electronic amplifying circuit comprises a phase shifting and level controlling means for maintaining the electric oscillating signal at a fixed amplitude.

6. An electronic device according to claim 1, wherein said device comprises an alternating current source for providing an alternating current to said first inductive element and said second inductive element.

7. An electronic device -according to claim 1, wherein said inductive elements are electromagnetic coils.

8. An electronic device according to claim 1, wherein said micro-electromechanical system is provided in a closed cavity.

9. An electronic device according to claim 8, wherein said closed cavity comprises a capping substrate and sealing elements for closing said cavity.

10. An electronic device according to claim 1, wherein said moveable element is a membrane.

11. A method for generating an electric oscillating signal based on a micro- electromechanical system on a substrate, the method comprising providing an alternating current in a first inductive element being fixed to said substrate and at least a second inductive element being fixed to a moveable element in order to generate a vibration of said moveable element converting said vibration of said moveable element in an alternating magnetic force on said substrate converting said alternating magnetic force on said substrate into an electric oscillating signal wherein converting said vibration comprises providing a DC current through a magnetic field inducing inductive element provided on said moveable element.

12. A method according to claim 11, said method furthermore comprising amplifying said electric oscillating signal and providing said amplified electric oscillating signal to said first inductive element and said at least a second inductive element.

13. A method according to claim 12, wherein amplifying said electric oscillating signal is controlled using said DC current.

14. A method according to claim 11, said method furthermore comprising maintaining the electric oscillating signal at a fixed amplitude.

* * * * *